United States Patent
Momoi et al.

(10) Patent No.: US 9,171,695 B2
(45) Date of Patent: Oct. 27, 2015

(54) STAGE APPARATUS AND SAMPLE OBSERVATION APPARATUS

(71) Applicant: Hitachi High-Technologies Corporation, Minato-ku, Tokyo (JP)

(72) Inventors: Yasuyuki Momoi, Tokyo (JP); Shigeru Haneda, Tokyo (JP); Naoki Sakamoto, Tokyo (JP); Masashi Shibahara, Tokyo (JP); Akito Tanokuchi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/411,286

(22) PCT Filed: Apr. 12, 2013

(86) PCT No.: PCT/JP2013/061009
§ 371 (c)(1),
(2) Date: Dec. 24, 2014

(87) PCT Pub. No.: WO2014/002579
PCT Pub. Date: Jan. 3, 2014

(65) Prior Publication Data
US 2015/0206704 A1    Jul. 23, 2015

(30) Foreign Application Priority Data
Jun. 26, 2012   (JP) .................. 2012-142592

(51) Int. Cl.
*H01J 37/20* (2006.01)
*G02B 21/26* (2006.01)
(Continued)

(52) U.S. Cl.
CPC ................ *H01J 37/20* (2013.01); *G02B 21/06* (2013.01); *G02B 21/26* (2013.01); *G05D 3/12* (2013.01);
(Continued)

(58) Field of Classification Search
CPC ............ G05D 3/12; G02B 21/26; H01J 37/20
USPC ....................................... 250/440.11, 442.11
See application file for complete search history.

(56) References Cited

U.S. PATENT DOCUMENTS 4,410,800 A * 10/1983 Yoshikawa ............... H01L 21/30
219/121.31
5,103,095 A *  4/1992 Elings .................... G01Q 10/04
250/307
(Continued)

FOREIGN PATENT DOCUMENTS

JP       2004-288918 A    10/2004
JP       2007-142093 A     6/2007
JP        2012-28281 A     2/2012

OTHER PUBLICATIONS

International Search Report dated Jun. 25, 2013 with English translation (five (5) pages).

*Primary Examiner* — David A Vanore
(74) *Attorney, Agent, or Firm* — Crowell & Moring LLP

(57) ABSTRACT

In order to provide a stage apparatus with high speed stability in addition to being able to achieve positioning with a high degree of accuracy, and a sample observation apparatus, such as an optical microscope and a scanning electron microscope, including the stage apparatus, the stage apparatus and the sample observation apparatus of the present invention correct a command voltage value of standard waveform data or an output timing of a command voltage value such that a difference between a first time history response and a second time history response is reduced to zero, the first time history response for displacement or speed when the stage mechanism is driven with use of the standard waveform data showing the command voltage value at each predetermined time and the second time history response for displacement or speed when a speed of the stage mechanism is constant, to be set as drive waveform data to be outputted to a drive unit of the stage mechanism.

13 Claims, 18 Drawing Sheets

(51) Int. Cl.
    *G05D 3/12*     (2006.01)
    *H01J 37/28*     (2006.01)
    *G02B 21/06*     (2006.01)
    *H01J 37/29*     (2006.01)

(52) U.S. Cl.
    CPC ............... H01J 37/28 (2013.01); H01J 37/292 (2013.01); *H01J 2237/20221* (2013.01); *H01J 2237/20264* (2013.01)

(56) References Cited

U.S. PATENT DOCUMENTS

| | | | | |
|---|---|---|---|---|
| 5,231,291 A * | 7/1993 | Amemiya | ............. | G03F 7/2041 250/440.11 |
| 5,990,477 A * | 11/1999 | Tomita | ................. | G11B 9/1454 250/306 |
| 6,278,113 B1 * | 8/2001 | Murayama | ............. | B82Y 35/00 250/442.11 |
| 7,348,571 B2 * | 3/2008 | Ue | ......................... | B82Y 35/00 250/306 |
| 7,663,124 B2 * | 2/2010 | Kasono | ................... | B82Y 10/00 250/396 R |
| 7,690,046 B2 * | 3/2010 | Yasuda | .................. | B82Y 35/00 310/316.01 |
| 7,735,146 B2 * | 6/2010 | Vertes | .................... | B82Y 20/00 250/281 |
| 7,884,326 B2 * | 2/2011 | van de Water | ......... | G01N 23/04 219/121.82 |
| 8,884,222 B2 * | 11/2014 | Rychen | .................. | G01Q 70/02 250/306 |
| 8,946,631 B2 * | 2/2015 | Noji | ........................ | G01N 23/225 250/310 |
| 2010/0268354 A1 * | 10/2010 | Takaishi | ............... | G11B 5/5582 700/37 |
| 2013/0082190 A1 | 4/2013 | Momoi et al. | | |

* cited by examiner

STAGE APPARATUS AND SAMPLE OBSERVATION APPARATUS

TECHNICAL FIELD

The present invention relates to a stage apparatus that moves a sample to be observed mounted on the stage apparatus to move an observation field of view in a sample observation apparatus such as an optical microscope and a scanning electron microscope, and a sample observation apparatus using the stage apparatus.

BACKGROUND ART

A scanning electron microscope (hereinafter, referred to as SEM) which is a representative charged particle beam apparatus is used for observation of defects or faults in a semiconductor pattern. In recent years, with miniaturization of semiconductor processes, in the SEM, observation at higher magnification is required. The SEM emits an electron beam (primary electron beam) onto the surface of a sample to be observed while scanning in a two-dimensional shape, and sets the intensity of a secondary electron and a reflection electron (hereinafter, referred to as secondary particle) secondarily generated from the sample as a luminance modulation input of an image scanned and generated in synchronization with scanning of the primary electron beam, thereby obtaining an image (SEM image) to be observed of the sample surface. At this time, a sample surface to be observed is selected by moving a stage with a sample mounted on the stage provided in the SEM. Usually, an operator operates operation input means, such as a trackball, while viewing the SEM image, and moves the stage until an intended sample surface portion is obtained as a SEM image. In this case, in order for the operator to easily recognize a current observation position, it is preferable to move the stage at constant speed such that the SEM image moves at constant speed. When observing a sample, such as a semiconductor wafer, in which the same fine patterns (cells) are continuous, a method which measures the number of cells (cell count) passing across a SEM screen using visual observation or image processing, and determines whether or not an intended portion has been reached is used. In this case, it is necessary to move the stage at constant speed such that the SEM image is moved at constant speed without oversight of cells. As described above, not only positioning with a high degree of accuracy is required so as to observe at high magnification, but speed stability is also required.

In a conventional stage mechanism, a positioning apparatus has been widely used, the positioning apparatus in which the ball screws are rotated by a stepping motor to move a stage through the nuts attached to the ball screws. However, in this mechanism, errors in the engagement between the ball screw and the nut, elastic deformation of the ball screw, errors in rotation of the stepping motor, etc. cause occurrence of so-called backlash immediately after the time when the movement direction of the stage is reversed, the stage is not moved in response to a command for movement of the stage, or the movement is smaller than a value by the command even if the stage is moved. As a result, the positioning with a high degree of accuracy cannot be obtained, thereby leading to one of causes which hinders the operability of the stage.

In order to solve such errors in the positioning, there has been disclosed a method in Japanese Patent Application Laid-Open Publication No. 2004-288918 (Patent Document 1) in which an ultrasonic motor composed of a piezoelectric element (electrostrictive element) is attached directly to a lower surface of the movable table to directly drive the stage, instead of a conventional stepping motor. Patent Document 1 discloses a drive system in which a piezoelectric element is pressed against a drive transmission surface provided to a lower surface of the stage, and accordingly, the drive transmission surface is linearly moved in the direction of movement of the stage with use of the shearing deformation of the piezoelectric element when a power voltage is applied, thereby driving the stage.

PRIOR ART DOCUMENTS

Patent Documents

Patent Document 1: Japanese Patent Application Laid-Open Publication No. 2004-288918

DISCLOSURE OF THE INVENTION

Problems to be Solved by the Invention

In Patent Document 1, there has been disclosed a control method of the alignment apparatus which, with use of two piezo drive bodies composed of a plurality of piezo elements, configures a walking operation drive unit capable of performing the walking operation by alternately attaching and detaching the respective piezo driving bodies to/from a movable object to be positioned to be able to correct errors in the movement control with use of the walking operation more accurately, thereby being able to finally achieve the positioning with a high degree of reliability and an extremely high degree of accuracy.

However, in such a control method, in order to perform the positioning with a high degree of accuracy, the errors in the positioning are corrected only at the stop of the device, but the speed stability is not secured. With the low speed stability, there are some problems such that it is difficult to see an observation screen properly due to fluctuation in the movement speed and an object to be observed is likely to be overlooked. As a result, the operability is deteriorated when an observer attempts to perform the positioning, thereby causing a problem that the positioning with a high degree of accuracy is difficult to be performed.

Therefore, it is an object of the invention to provide a stage apparatus with high speed stability, in addition to being able to achieve positioning with a high degree of accuracy.

Means for Solving the Problems

To achieve the object described above, a stage apparatus of the present invention including, for example, a stage mechanism that moves a sample mounted on the stage mechanism, a drive unit that drives the stage mechanism, a stage operation input unit that inputs an operational command for the stage mechanism, and a stage control unit that controls the stage mechanism in accordance with an input from the stage operation input unit, the stage apparatus includes: a waveform generation unit that generates a voltage signal to be outputted to the drive unit from a command value that is inputted by the stage operation input unit and drive waveform data that shows a command voltage value at each predetermined time; an amplification unit that amplifies the generated voltage signal to be outputted to the drive unit; and a storage unit that stores standard waveform data showing a command voltage value at each predetermined time, and correction data correcting the standard waveform data so as to move the drive unit at constant speed, and the correction data corrects a command voltage value of the standard waveform data or an output timing of a command voltage value such that a difference between a first time history response and a second time history response is reduced to zero, the first time history response for displacement or speed when the stage mechanism is driven with use of the standard waveform data and the second time history response for displacement or speed when a speed of the stage mechanism is constant, and the standard waveform data is corrected by the correction data to be set as the drive waveform data.

Effects of the Invention

According to the present invention, there is provided a stage with high speed stability, in addition to being able to achieve positioning with a high degree of accuracy.

BRIEF DESCRIPTIONS OF THE DRAWINGS

BEST MODE FOR CARRYING OUT THE INVENTION

Hereinafter, embodiments of the present invention will be described with reference to the drawings. In the following, an example of a scanning electron microscope will be described, but the present invention is not limited thereto. The present invention can be also applied to a sample observation apparatus such as an optical microscope, an ion microscope and a scanning transmission electron microscope (STEM). In particular, when an object to be observed is fine, the positioning with high accuracy and the high stability in a stage speed are required. Therefore, the present invention is useful in such apparatuses.

First Embodiment

Figure 1:
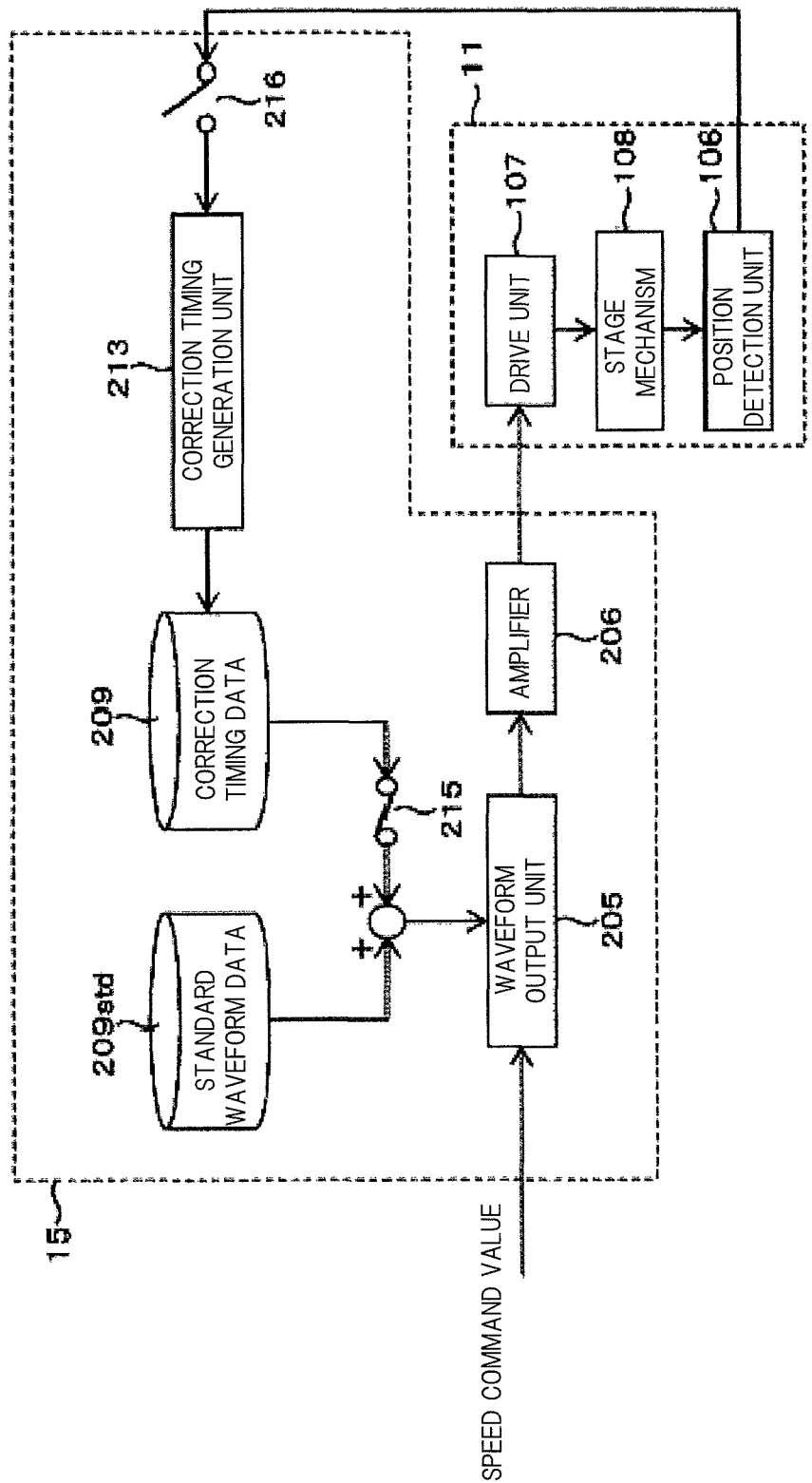
FIG. 1 is an example of a configuration diagram of a stage apparatus illustrating a first embodiment of the present invention.

A stage apparatus illustrating a first embodiment of the present invention will be described. In FIG. 1, a stage 11 includes a position detection unit 106 that drives a stage mechanism 108 by a drive unit 107 such as a motor 104 and measures movement distance of the stage. The stage mechanism 108 includes a movable table 101 that mounts a sample 12 to be observed. The stage 11 is controlled by a stage control unit 15. The stage control unit 15 outputs a command value to be provided to the motor 104. The stage control unit 15 includes a switch 215, a switch 216, a waveform output unit 205, standard waveform data 209std, correction timing data 209, and correction timing generation unit 213. The standard waveform data 209std and the correction timing data 209 are stored into, for example, a memory, etc. With use of the waveform output unit 205, the stage apparatus controls waveform data and timing from the standard waveform data 209std and the correction timing data 209, thereby achieving the drive with a high degree of accuracy and speed stability. The waveforms outputted from the waveform output unit 205 are amplified in an amplifier 206 and transmitted to the drive unit 107.

Figure 2:
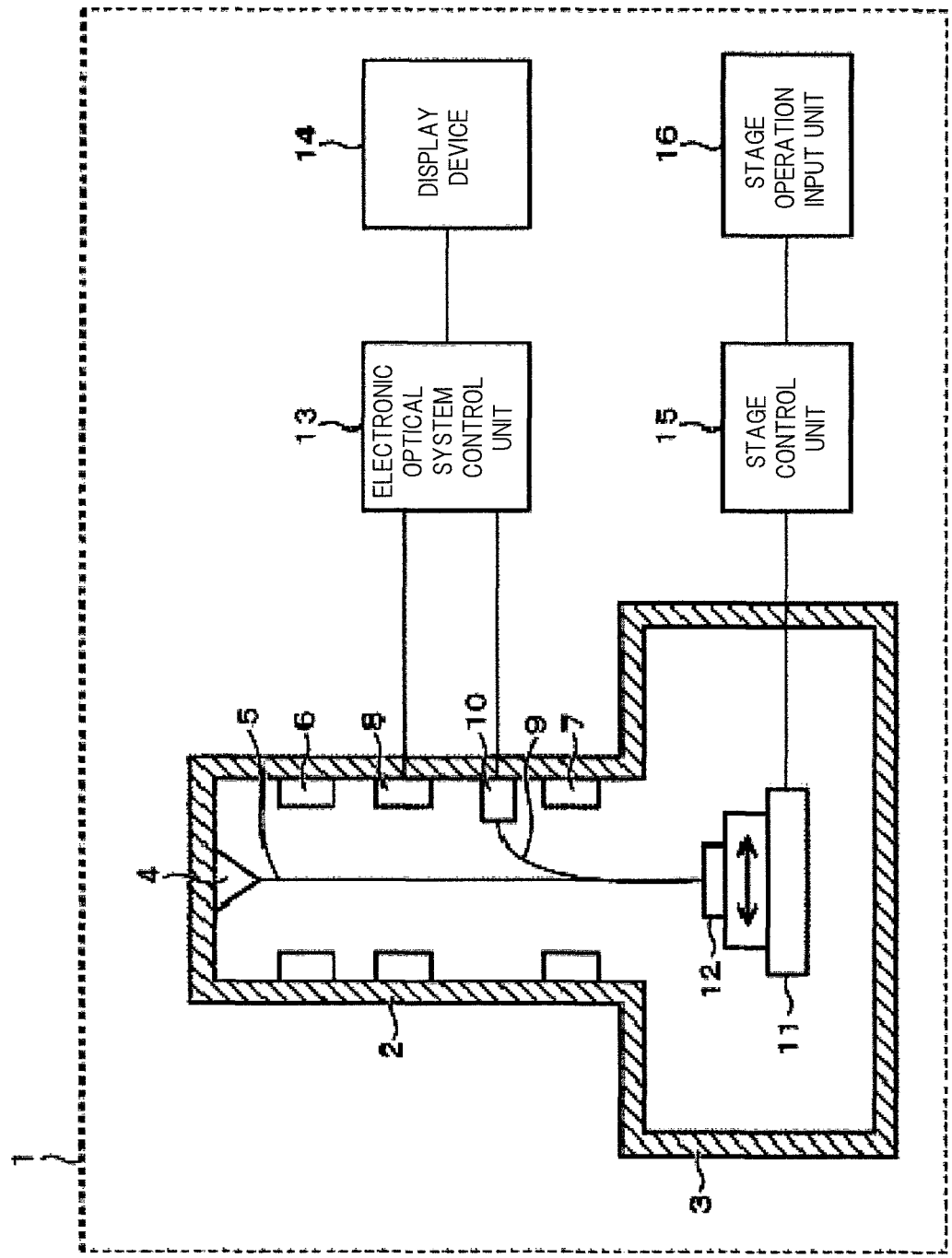
FIG. 2 is a configuration diagram of a scanning electron microscope using the stage apparatus.

A configuration of the SEM that is used in a stage apparatus of the present embodiment will be described with reference to FIG. 2. A SEM 1 includes a lens barrel 2 having an electronic optical system, a sample chamber 3, a stage 11, and other control units and computers. A primary electron beam 5 generated from an electron gun 4 is emitted onto a sample 12 through a convergence lens 6 and an objective lens 7, and a secondary particle 9, such as a secondary electron and a reflection electron, generated from the sample 12 is detected by a secondary electron detector 10. The primary electron beam 5 scans a surface of the sample 12 to be observed in a two-dimensional shape by a scanning polarizer 8. Electronic optical system control unit 13 controls the scanning of the primary electron beam 5 using the scanning polarizer 8, and sets the intensity of the secondary particle 9 detected by the secondary electron detector 10 as a luminance modulation input of an image scanned and generated in synchronization with the scanning of the primary electron beam to generate an image (SEM image) to be observed of the sample surface. The generated SEM image is displayed on a display device 14. Further, the SEM image may be stored into a recording device (not illustrated).

The sample 12 to be observed is mounted on the stage 11 provided in the sample chamber 3. The stage 11 moves and rotates the sample 12, and has a degree of freedom, such as a horizontal direction (XY direction), an up-down direction (Z direction), rotation (rotation around the Z axis), and inclination (in the drawing, only one degree of freedom is shown). Stage control unit 15 controls the stage 11 in accordance with an input from a stage operation input unit 16 which is an input device, such as a trackball or a joystick. As the stage operation input unit 16, a PC connected through a network or a serial interface may be used. Note that the electronic optical system control unit 13 and the stage control unit 15 may be configured with hardware, or may be achieved by a program to be executed in a computer that controls the SEM as software.

A sample surface to be observed is selected by positioning the stage 11. The operator operates the stage operation input unit 16 while viewing the SEM image, and moves the stage 11 until an intended region to be observed is obtained as a SEM image. At this time, with the low speed stability, not only the operability is deteriorated due to a bad response to operation inputs, but an object to be observed is also likely to be overlooked if a rapid fluctuation in speed occurs. When observing a sample, such as a semiconductor wafer, in which the same fine patterns (cells) are continuous, a method that inputs a movement direction and speed from the stage operation input means 16 into the stage control unit 15 to move the stage 11 at constant speed, and measures the number of cells passing across the SEM image screen through visual observation of the operator or through image processing to determine whether or not an intended region has been reached is used. In this case, the cells to be measured are also likely to be overlooked if a rapid fluctuation in speed occurs, thereby causing a problem that a position cannot be properly detected.

A mechanism unit of the stage apparatus of this example will be described with reference to FIG. 3. In the stage 11, a sample is attached to the movable table 101, and the movable table 101 is moved along guide rails 102 attached to abase 100 to move the sample. A linear actuator is used as a driving unit for moving the movable table. The linear actuator includes a shaft 103 and a motor 104, and when a driving signal is inputted into the motor 104, the motor 104 moves along the shaft 103. The motor 104 is attached to the movable table 101, and the shaft 103 is attached to the base. Note that the shaft 103 may be attached to the movable table 101 and the motor 104 may be attached to the base.

As a position detection unit for detecting the position of the movable table 101, for example, a linear scale having a scale 105 and a sensor head is used. The scale 105 has slits at constant intervals, and a pulse is generated at each time when the sensor head passes above each slit. The number of pulses is measured, thereby obtaining the position. The scale 105 is attached to the base 100, and the sensor head is attached to the movable table 101. Note that as the position detection unit, a laser interferometer, a laser displacement meter and etc. may be used.

The stage control unit 15 performs control computation from a command value inputted from the stage operation input unit 16 and position information detected by the position detection unit, and outputs a driving signal to the motor 104 to operate the stage. Herein, a configuration in which a feedback control is performed using the position information is shown, but an open-loop control may be performed without using the position information.

Figure 3:
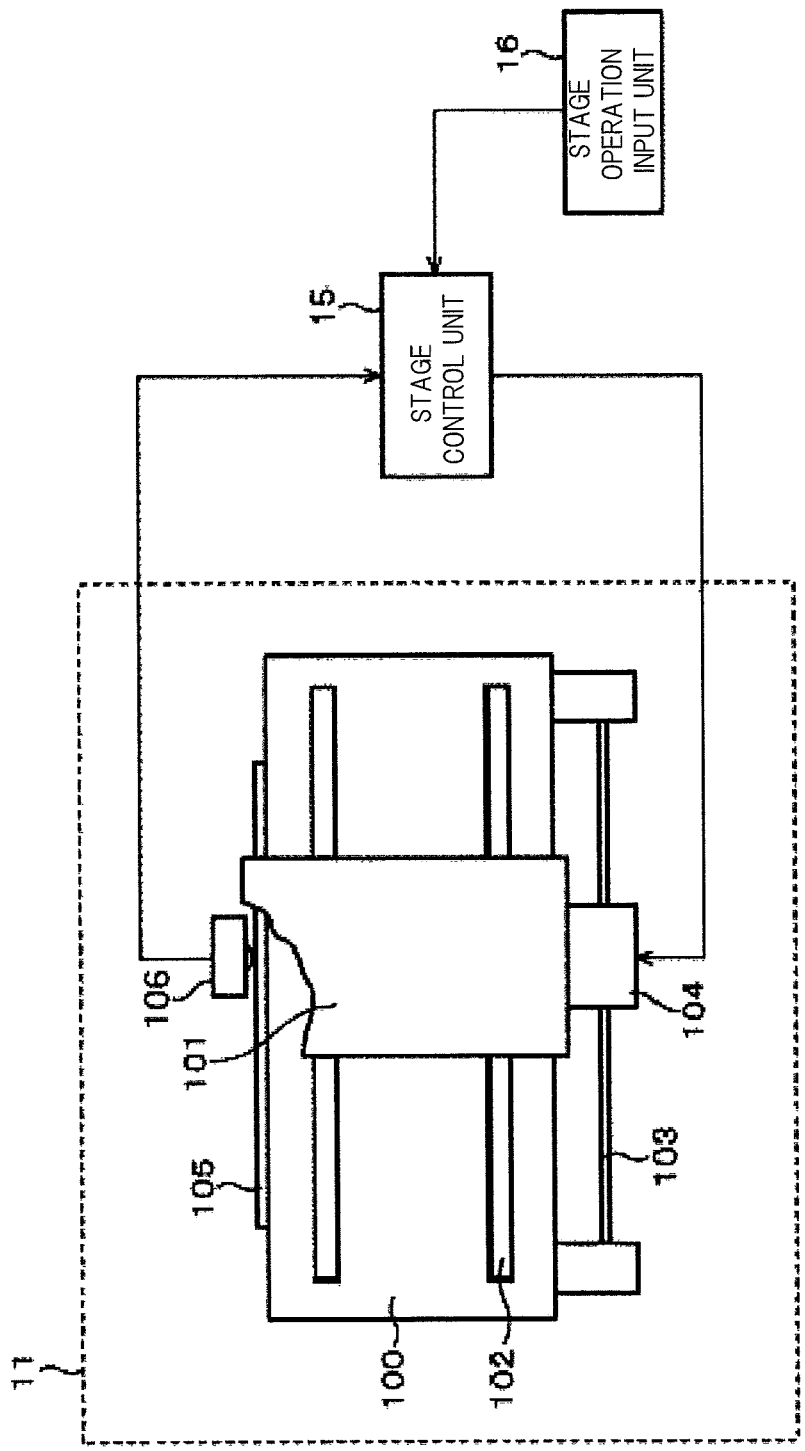
FIG. 3 is an example of a configuration diagram of a stage mechanism.

Although FIG. 3 illustrates the configuration of the stage having one degree of freedom, a stage having multiple degrees of freedom can be configured by combining the similar stages.

Figure 4:
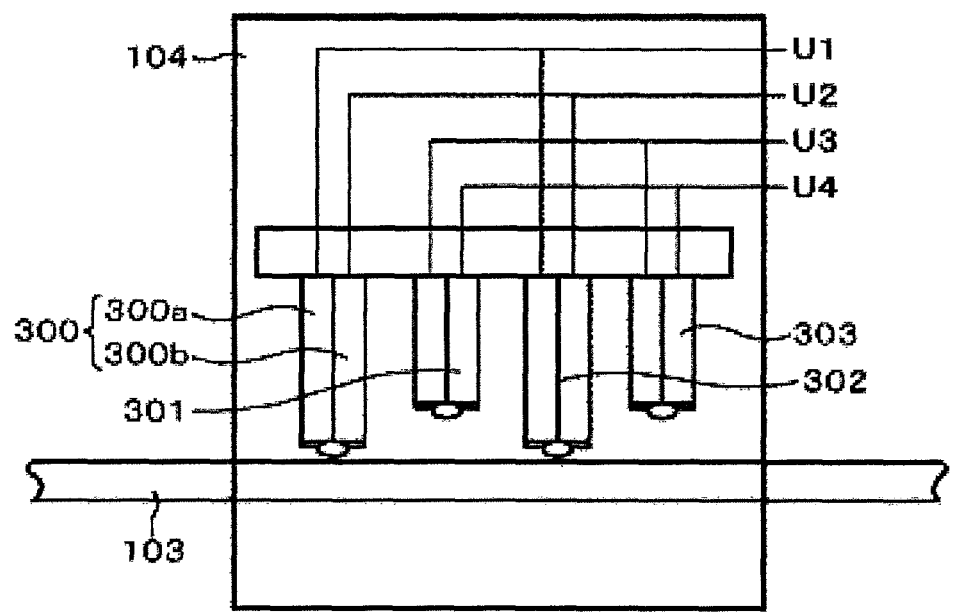
FIG. 4 is an example of a configuration diagram of a walking-type piezo motor used in the present invention.
Figure 5:
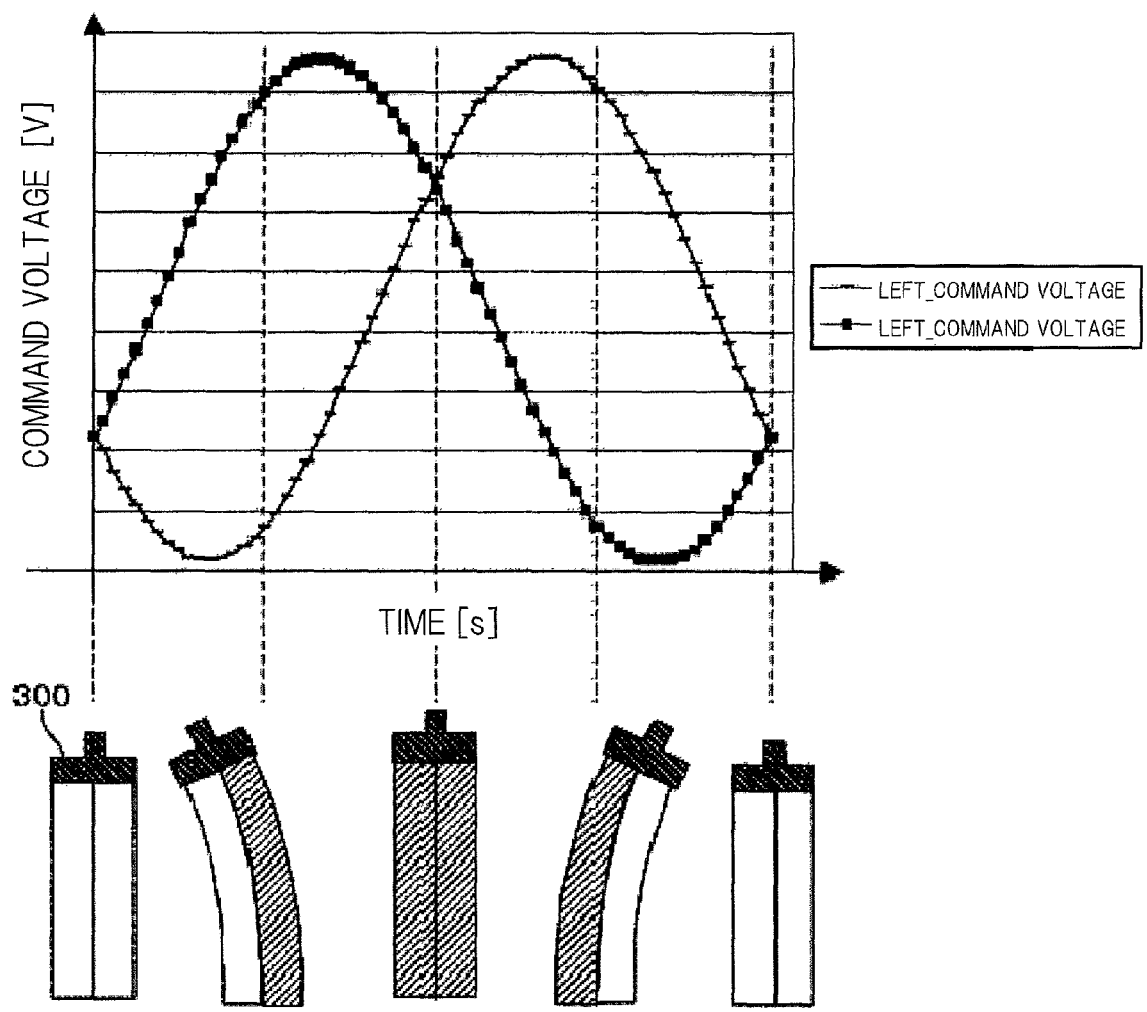
FIG. 5 is a diagram explaining an operation of piezo elements used in the present invention.
Figure 6:
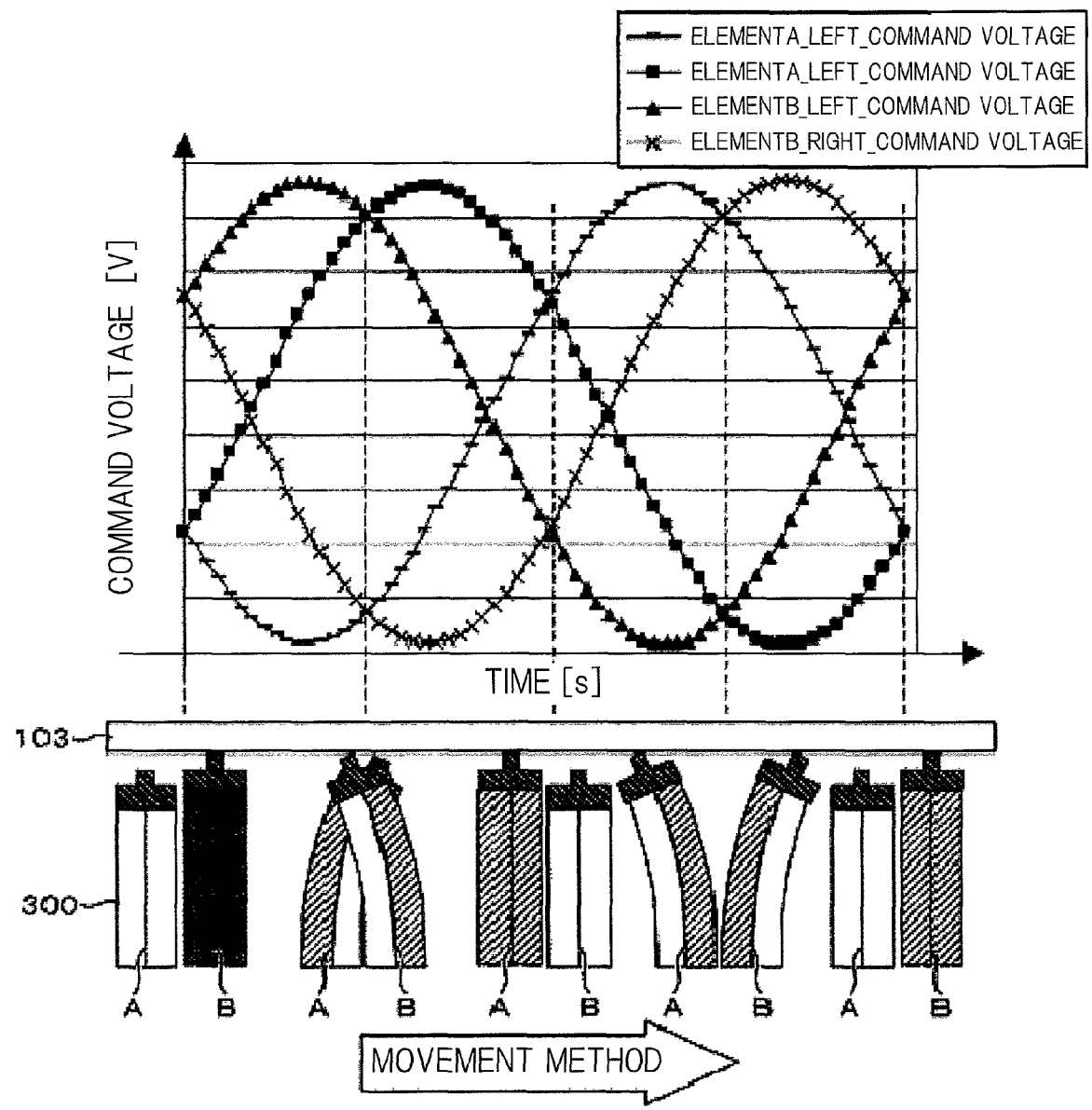
FIG. 6 is a diagram explaining an operation of the walking-type piezo motor used in the present invention.

An example of a drive unit used in a stage of the present embodiment will be described with reference to FIGS. 4 to 6. Herein, an example of a walking-type piezo motor will be described. A configuration example of the piezo motor will be described in FIG. 4. There are piezo elements 300, 301, 302, and 303 inside the motor 104, the piezo elements 300, 301, 302, and 303 each having laminated piezo plates 300*a* and 300*b* pasted together, and a tip of each piezo element is pressed against the shaft 103 by a spring (not illustrated). For example, FIG. 5 illustrates an operation of piezo elements corresponding to command voltages to be inputted into the piezo elements. For example, when the command voltages illustrated in FIG. 5 are pasted to be provided to the laminated piezo plates 300*a* (right) and 300*b* (left), the piezo elements can expand and contract or can be bent depending on a sum and difference of the command voltages. Accordingly, the piezo elements are operated such that the tip of the piezo element draws an elliptical orbit. FIG. 6 illustrates an operation principle of the walking-type piezo motor by extracting two of the piezo elements. When the command voltages as illustrated in FIG. 6 are provided to piezo elements A and B, the piezo elements are operated as if they were walking on the ground. For example, the motor 104 makes a movement while the piezo element A is operated in contact with the shaft 103 and the piezo element B performs return operation during that time. The operation for one cycle is not limited to a length of a specific cycle. Therefore, voltage data in which waveform for one cycle is equally divided (normalized) is prepared and an output time interval (hereinafter, referred to as "normalized unit time") of the voltage data is changed (expanded and contracted), and a cycle of the command voltage waveform is changed to control the speed. FIG. 5 and FIG. 6 illustrate waveforms of driving signals for one cycle. However, when the motor is continuously moved, it is also possible to repetitively provide the waveforms. Note that this is one configuration example of the driving unit, and is not intended to limit the present invention.

Figure 7:
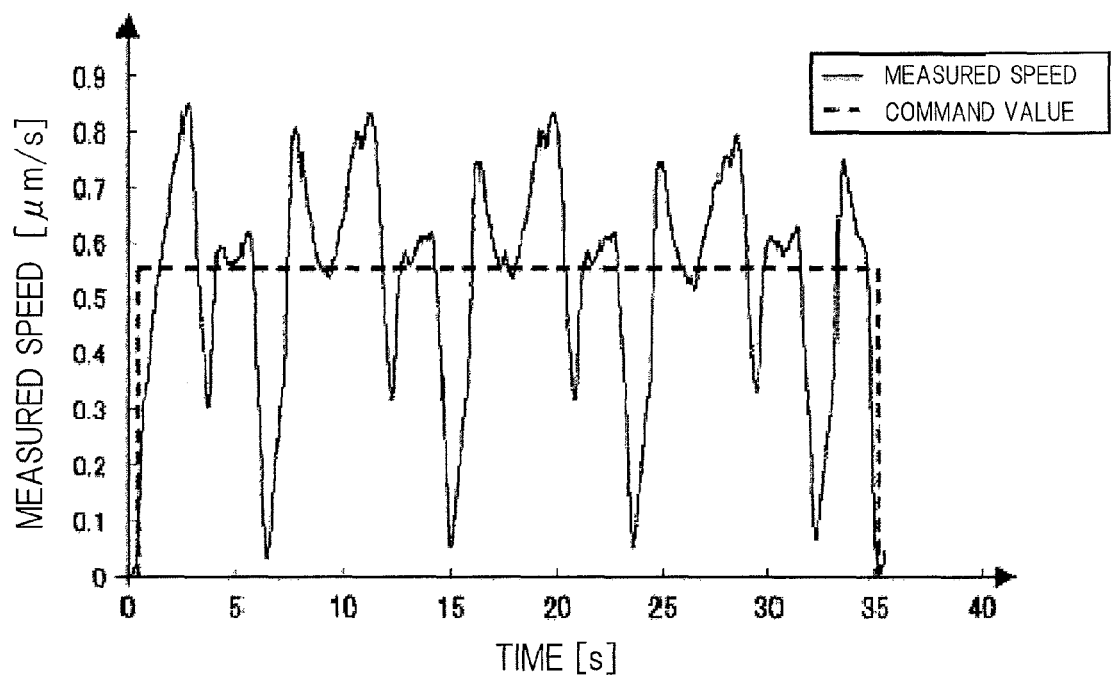
FIG. 7 is a diagram illustrating a speed response of the walking-type piezo motor when standard waveform data is used.

FIG. 7 illustrates a speed response waveform when command voltage waveforms of four cycles are inputted from a waveform generation unit at constant output timing. Through FIG. 7, it is understandable that a speed fluctuation is large with respect to a command speed. This is because variations are generated in angles, lengths and particularly bending amount of the piezo elements, so that the speed stability is deteriorated.

Figure 8:
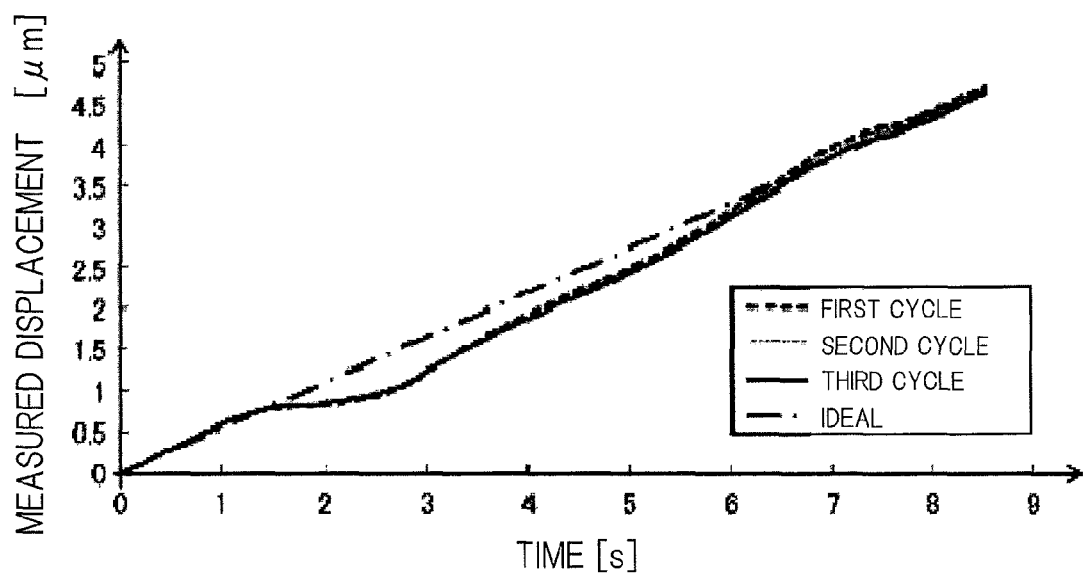
FIG. 8 is a diagram illustrating a displacement response of the walking-type piezo motor when the standard waveform data is used, and explaining cyclic nature of speed fluctuations of the walking-type piezo motor.
Figure 9:
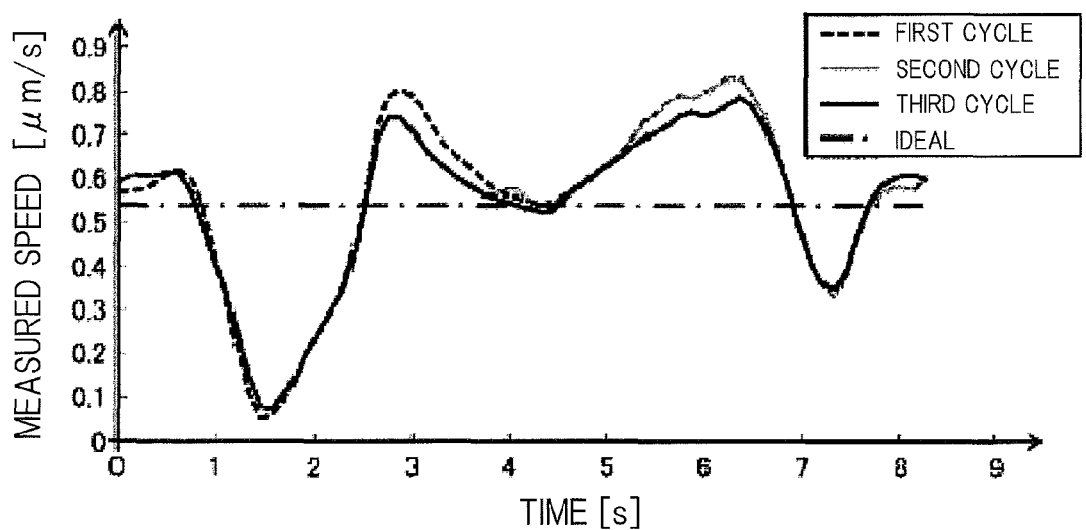
FIG. 9 is a diagram illustrating a speed response of the walking-type piezo motor when the standard waveform data is used, and explaining cyclic nature of speed fluctuations of the walking-type piezo motor.

Next, each half-cycle of the command voltage waveforms at the time of movement start and at the time of movement finish in FIG. 7 is removed from the four cycles to extract three cycles. FIG. 8 and FIG. 9 illustrate a displacement response and a speed response for each one cycle of such three cycles. Through FIG. 8 and FIG. 9, it is understandable that the waveform shapes of a displacement response and a speed response from the first cycle to the third cycle are almost identical with each other. That is, an actual displacement response and an actual speed response for the command value have cyclic nature, and the cycle is identical with the cycle of the command voltage waveform. Further, the cyclic nature can be confirmed regardless of a driving position and speed of the stage mechanism. Therefore, in the present invention, with use of the cyclic nature, output timing correction data of command voltage waveform is computed from the preliminarily measured displacement or speed to make the command voltage output timing changeable, and it is possible to perform the drive with high speed stability.

Figure 19:
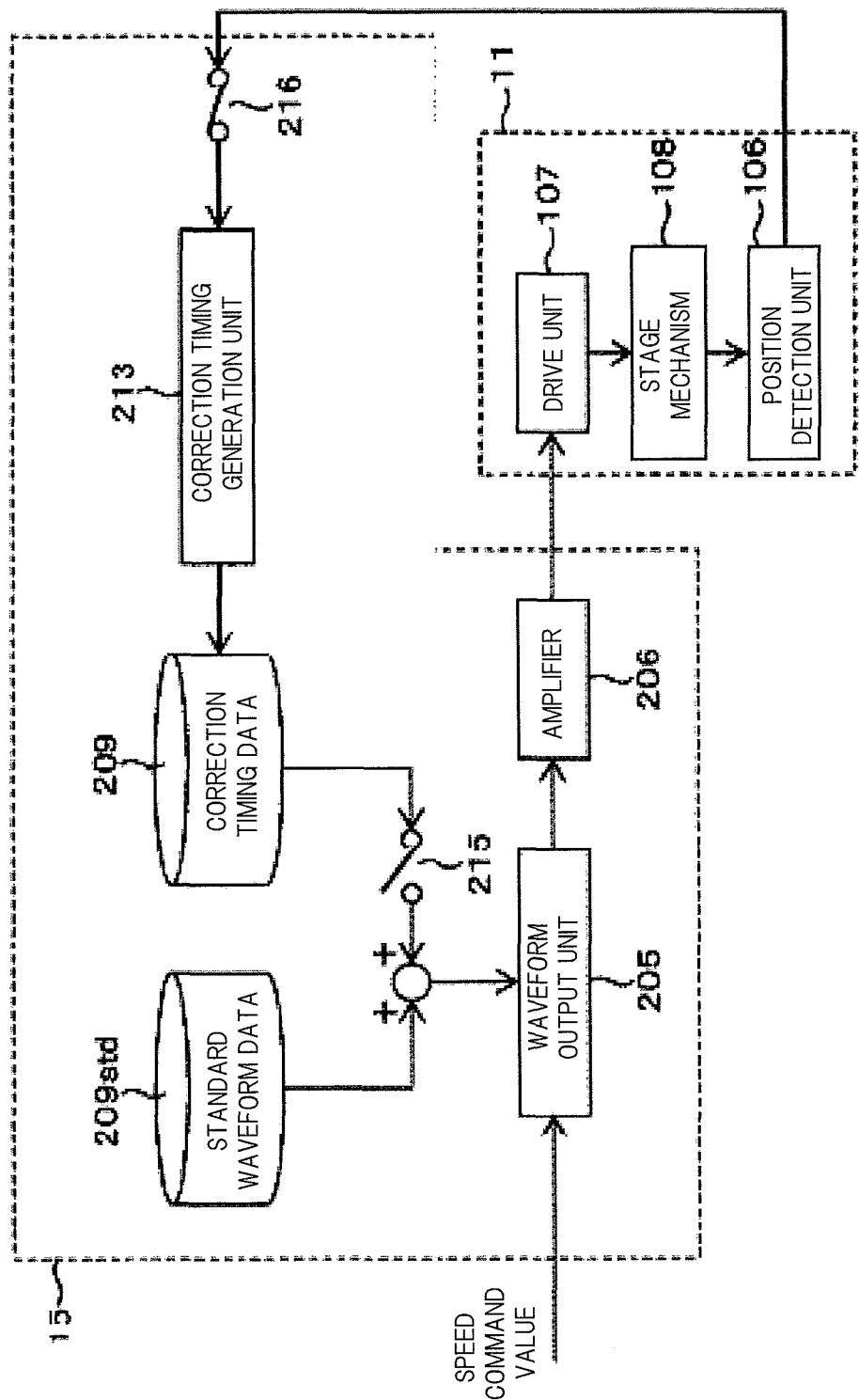
FIG. 19 is an example of a configuration diagram illustrating a switching state during the generation of correction data.

Herein, a specific generation method of correction data will be described with reference to FIG. 19 and FIG. 10. FIG. 19 illustrates a switching state during the generation of correction data. With the switch 215 OFF and the switch 216 ON, the standard waveform data is outputted from a waveform output generation unit at constant time intervals, and in the correction timing generation unit 213, the correction timing data 209 is generated from position or speed data obtained from the position detection unit 106 so as to move the movable table at constant speed. Herein, assume that the standard waveform data is provided by x(i) at time i. The standard waveform data shows a command voltage value at each predetermined time, and when no correction in the present embodiment is performed, the command voltage waveform is determined for the drive unit based on only the standard waveform data. Note that, in the present embodiment, "predetermined time" refers to the preliminarily given time interval, and generally means each "constant time interval" in many cases. However, the present invention is not limited thereto.

x(i) may be provided as a table relating to i, or may be provided as a function relating to i. Herein, an example of the former case will be described. Assume that a displacement that is obtained when x(i) is outputted at a constant time interval Δtstd by the waveform generation unit to operate a stage is y(i). When the stage is moved at a constant speed v, an ideal time when the displacement y(i) is reached is to be y(i)/v. However, a speed fluctuation occurs in reality, so that the time when the displacement y(i) is reached differs from the ideal time. As a result, the difference is Δt(i)=i·Δtstd−y(i)/v. Therefore, as for a value of the command voltage x(i) at the time I, by outputting such a value by shifting the amount of Δt(i), it is possible to operate the stage at constant speed v. That is, the correction data defines a time interval Δt(i) that shifts an output timing of a command voltage value of the standard waveform data such that the difference between a first time history response and a second time history response is reduced to zero, the first time history response for the displacement (FIG. 8) or the speed (FIG. 9) when the stage mechanism is driven with use of the standard waveform data, the second time history response for the displacement or the speed when a speed of the stage mechanism is constant. Since an output timing of the command voltage value is shifted by the amount of Δt(i), the time when the displacement y(i) is reached is to be y(i)/v in reality, and the time is identical with an ideal displacement when a speed of the stage mechanism is constant.

Note that the standard waveform data and the correction data are stored into a storage unit (not illustrated) such as a memory and hard disk that is connected to the stage control unit 15.

Further, it is also possible to maintain the correction data for the normalized time described above. Therefore, this enables correction to be performed with the use of the same correction data, even when a stage speed is changed.

Figure 10:
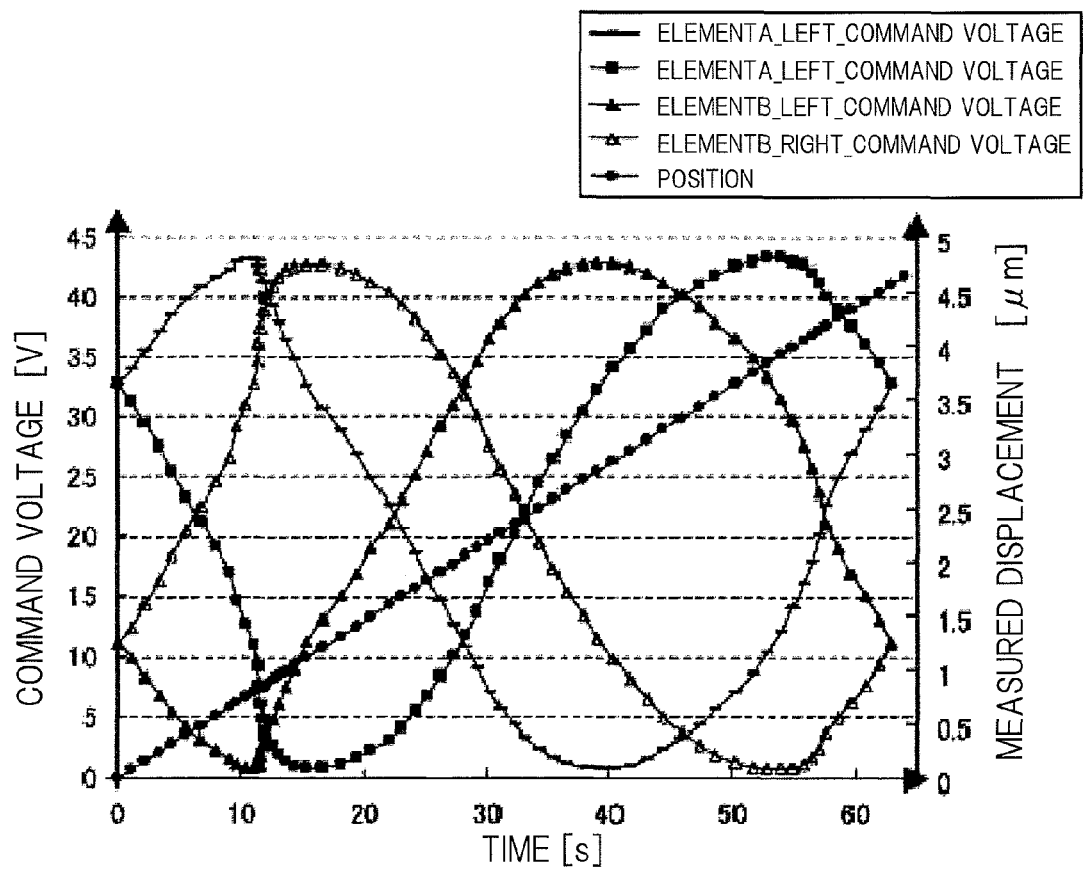
FIG. 10 is a diagram illustrating a displacement response in the first embodiment.

FIG. 10 illustrates command voltages and measured displacements when an output timing of the standard waveform data x(i) is corrected by the correction data Δt(i) obtained as described above to operate the stage. As is clear from FIG. 10, it is confirmed that the stage operates at constant speed.

As described above, the use of the stage apparatus of the present embodiment enables a speed fluctuation to be reduced, thereby being able to obtain high speed stability.

Second Embodiment

Figure 11:
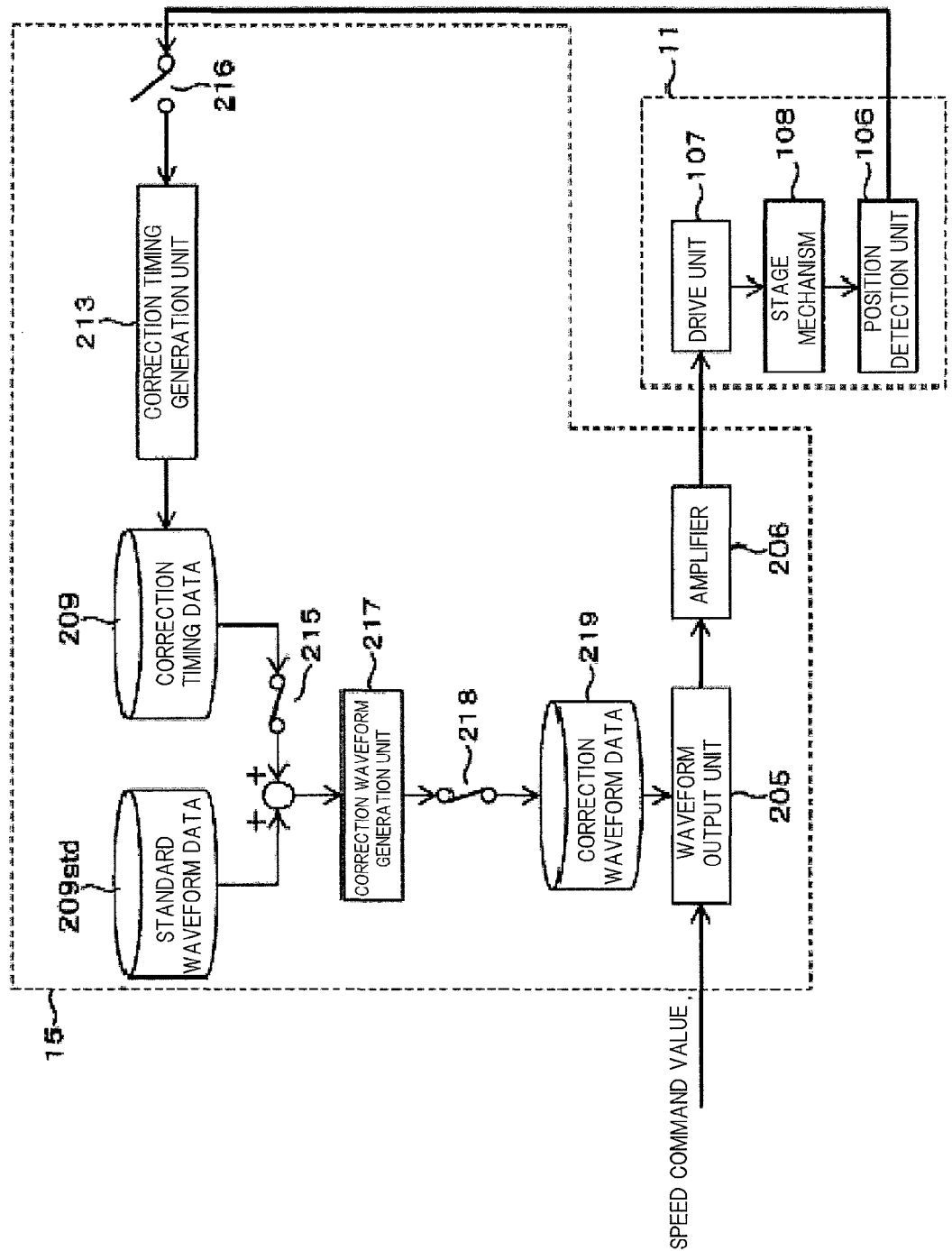
FIG. 11 is an example of a configuration diagram of the stage apparatus illustrating a second embodiment of the present invention.

FIG. 11 illustrates another configuration of the present invention. Hereinafter, the parts that are the same as those of the first embodiment will be omitted in explanation. In the present embodiment, a shift of an output timing computed in the first embodiment is converted into fluctuation in a voltage value that is outputted at each constant time to define the correction data as a command voltage value. Note that hereinafter "correction data" includes "correction timing data" described in the first embodiment and "correction waveform data" that will be described in this embodiment. Further, these data can be substituted, unless otherwise specified.

In FIG. 11, a correction waveform generation unit 217 that generates correction waveform data 219 and a switch 218 are added in addition to the configuration of FIG. 1. As described in the first embodiment, the correction waveform generation unit 217 computes the correction value Δt(i) of an output timing of the correction waveform data x(i) by the correction timing generation unit 213, and converts the correction value Δt(i) into voltage data of the constant time interval Δtstd, and the voltage data is set as the correction waveform data 219. Therefore, the correction waveform data 219 is the waveform data that shows time transitions of the voltage command values at constant time intervals.

Figure 12:
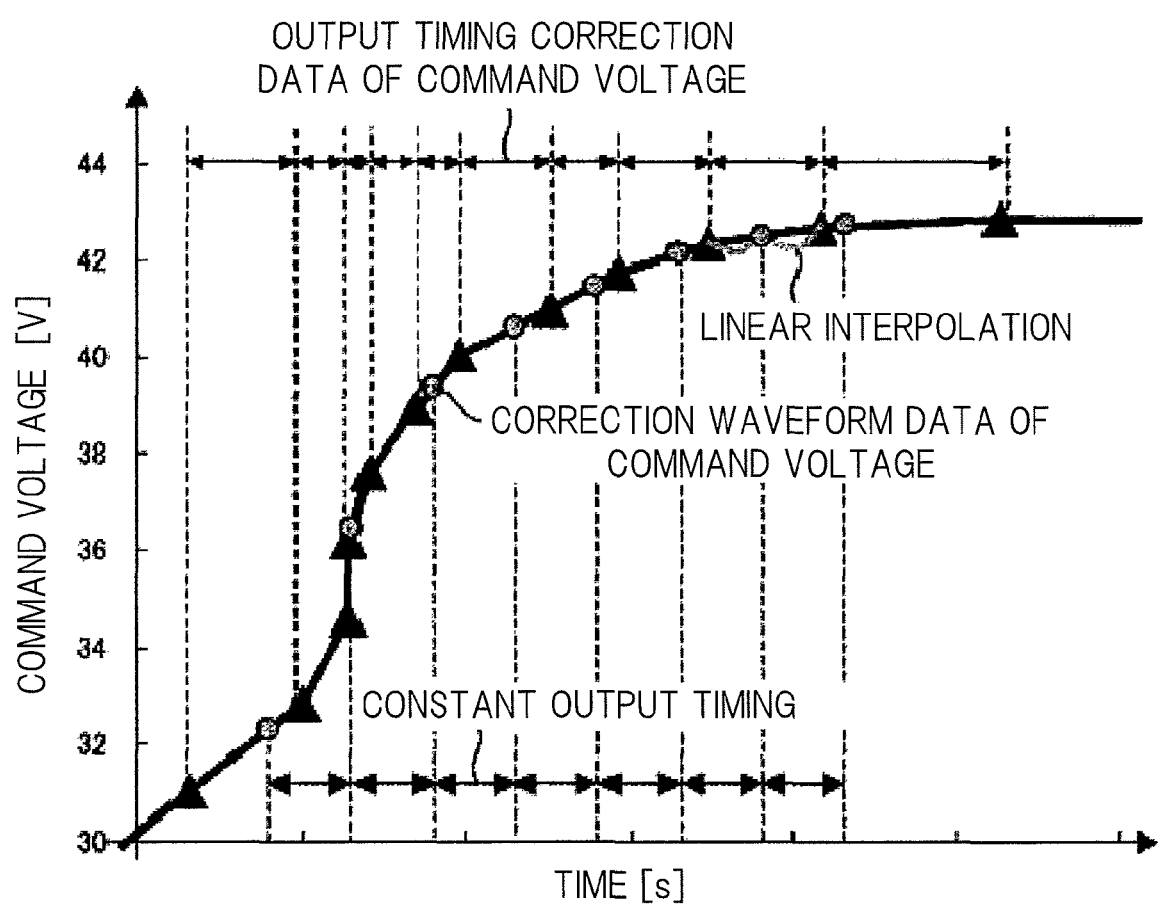
FIG. 12 is a schematic view illustrating a generation method of correction waveform data in the second embodiment of the present invention.

With the use of FIG. 12, a generation method of the correction waveform data will be described. First, waveform data obtained by shifting an output timing of x(i) by the amount of Δt(i) is generated (curve line by arrow in FIG. 12). The command voltage in each dot (circular dots in FIG. 12) is computed at each constant time interval Δtstd by performing linear interpolation from before and after plot points of the time. This enables the same waveform data to be obtained as table x'(i) of the command voltage value of the constant time interval Δtstd, and it is possible to set the same waveform data as the correction waveform data. In the actual operation, when x(i) is outputted at the constant time interval Δtstd, the same effect as the time when the output timing of x'(i) is shifted can be eventually obtained, thereby being able to operate a stage at constant speed.

As described above, the use of the stage apparatus of the present embodiment also enables a speed fluctuation to be reduced, thereby being able to obtain high speed stability.

Third Embodiment

Figure 13A:
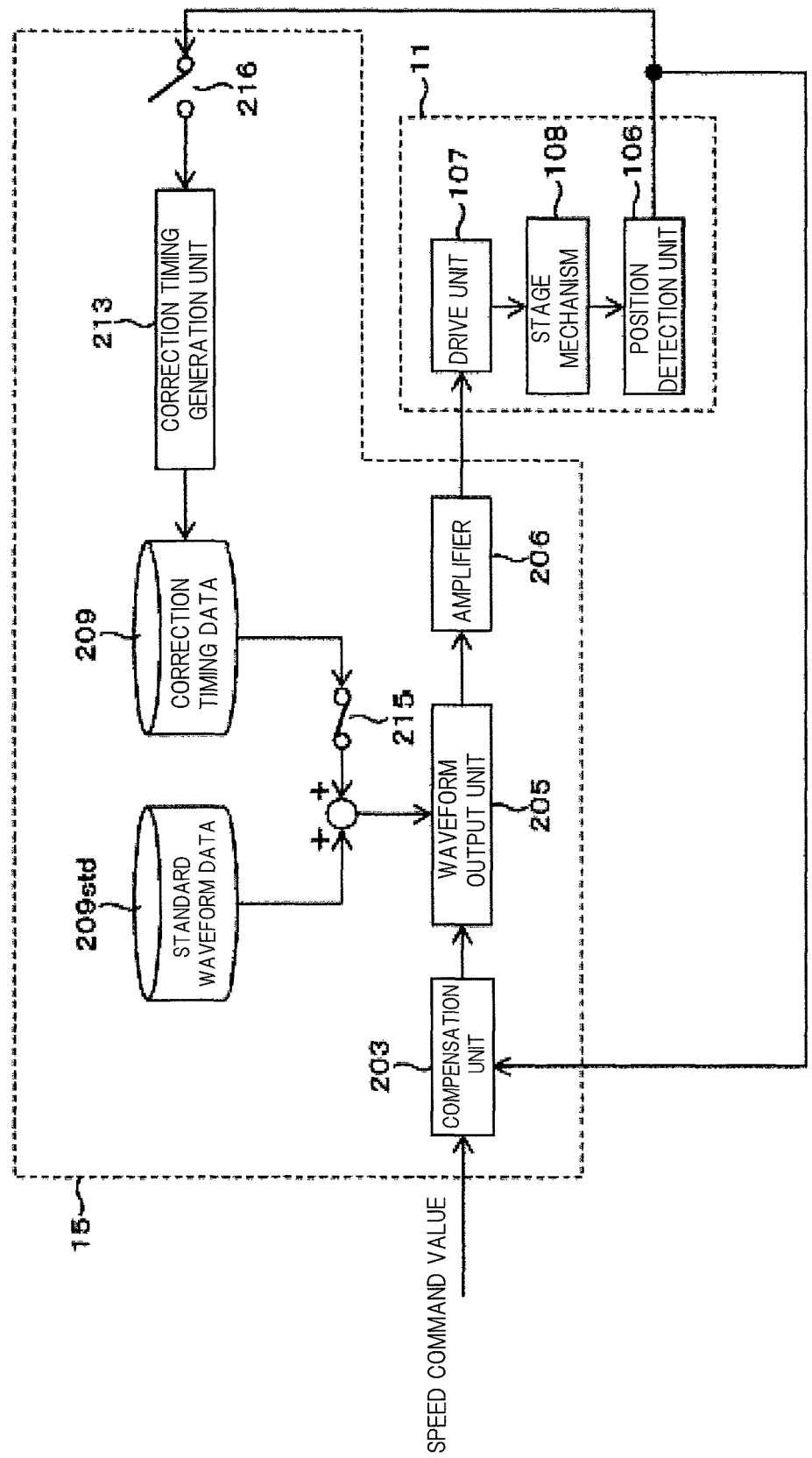
FIG. 13a is a configuration diagram of the stage apparatus illustrating a third embodiment of the present invention.

Another configuration of the present invention will be described in FIG. 13a and FIG. 13b. Hereinafter, the parts that are the same as those of the first and second embodiments will be omitted in explanation. In this embodiment, a compensation unit 203 that computes a command value to be inputted into the waveform generation unit from current stage position information detected by the stage detection unit and a speed command value is added to the configurations of FIG. 1 or FIG. 11 in a state that the switch 216 is OFF. With the use of correction data that is computed as described in FIG. 1 and FIG. 11, it is possible to compensate variations in angles, lengths and particularly bending amount of the piezo elements. However, due to disturbance, stage inclination and fluctuations in sample load, the speed fluctuation is also generated. It is therefore possible to reduce an influence of the fluctuations in such loads by feeding back the position information, as described in FIG. 13a and FIG. 13b.

Fourth Embodiment

Another configuration of the present invention will be described in FIG. 14. Hereinafter, the parts that are the same as those of the first to third embodiments will be omitted in explanation. In this embodiment, with a focus on fluctuation in the correction waveform data for stage load, a plurality of correction data are provided according to a degree of the stage load. Herein, the stage load is the magnitude of force required for moving the stage due to movable mass generated by stage inclination and sample mass, and sliding friction generated by the guide rails 102. In a general-purpose electron microscope that observes many types of samples by various methods, the method of the present embodiment is particularly effective.

Figure 13B:
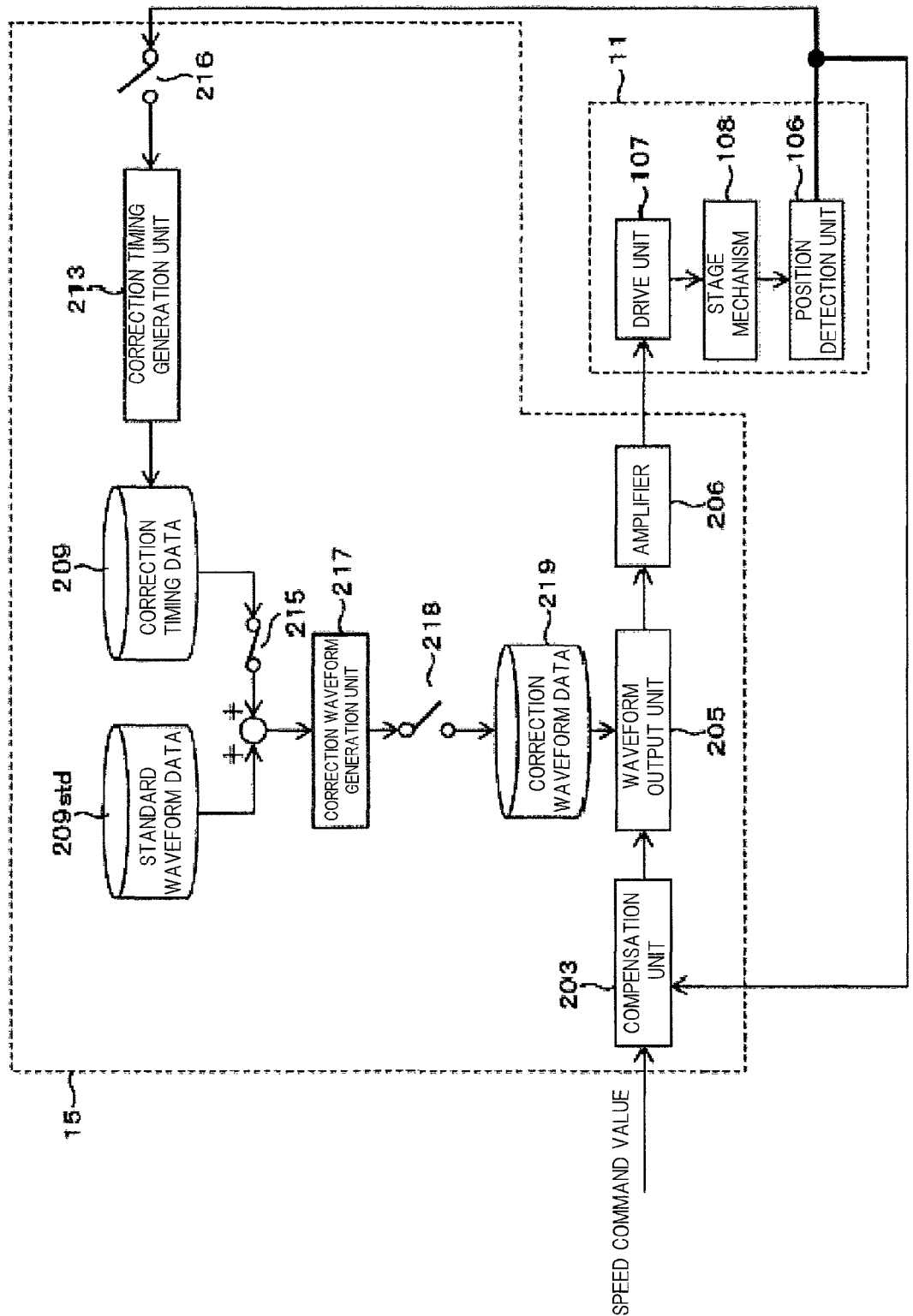
FIG. 13b is a configuration diagram of the stage apparatus illustrating the third embodiment of the present invention.
Figure 14:
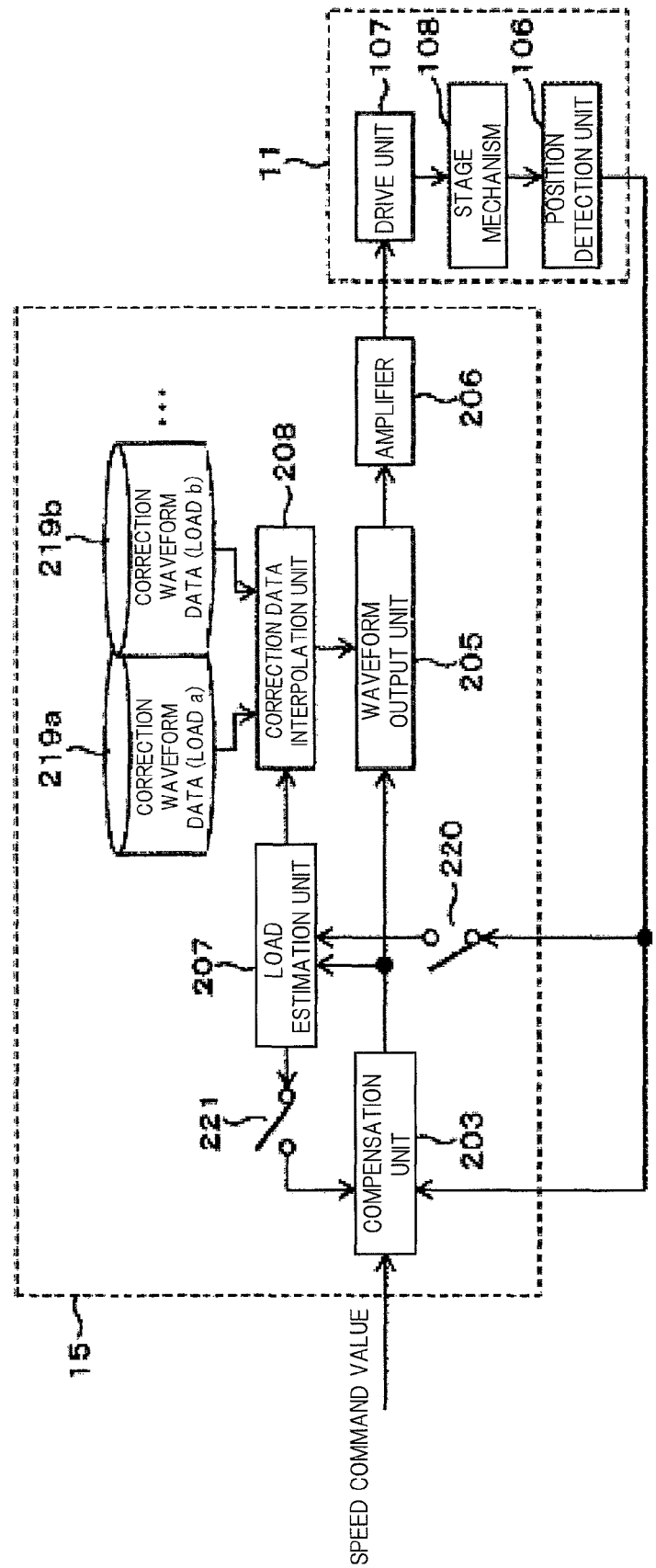
FIG. 14 is a configuration diagram of the stage apparatus illustrating a fourth embodiment of the present invention.

In the configuration of FIG. 14, a load estimation unit 207, at least two pieces of correction waveform data 219a, 219b, etc., a correction data interpolation unit 208, a switch 220, and a switch 221 are added to the configuration of FIG. 13b. As to at least two pieces of correction data, the correction waveform data is computed in any loading state (for example, minimum loading state and maximum loading state), and the correction waveform data can be obtained by the method described in the first embodiment or the second embodiment in a state that the load is changed (change of stage inclination and sample load). When an inclination angle is known, the load estimation unit 207 estimates load F applied to the stage by inclination angle information obtained from the compensation unit 203. Further, when an inclination angle is not known, with the switch 220 ON, the load estimation unit 207 can also estimate load F by position information obtained from the position detection unit 106 and a command value for waveform output unit 205. The correction data interpolation unit 208 generates a drive waveform to be used by the waveform generation unit from a plurality of correction data 209a, 209b, etc. and the load F estimated by the load estimation unit 207. Assume that the correction data in load F1 is x'1(i) and the correction data in load F2 is x'2(i), a correction waveform x'(i) corresponding to the estimated load F can be obtained by, for example, linearly interpolating x'1(i) and x'2(i). It is known that the correction data computed as described in the first and the second embodiments is differently shaped because of the difference in the stage load, and as described in the present embodiment, since the correction data can be generated depending on a loading state of the stage, the correction with a high degree of accuracy can be performed and the speed fluctuation can be further reduced, and it is possible to obtain higher speed stability.

Further, with the switch 221 ON, as for a parameter of the compensation unit 203 that performs a feedback control, for example, a feedback gain is changeable by the stage load, thereby being able to achieve compensation with a higher degree of accuracy.

Fifth Embodiment

Figure 15:
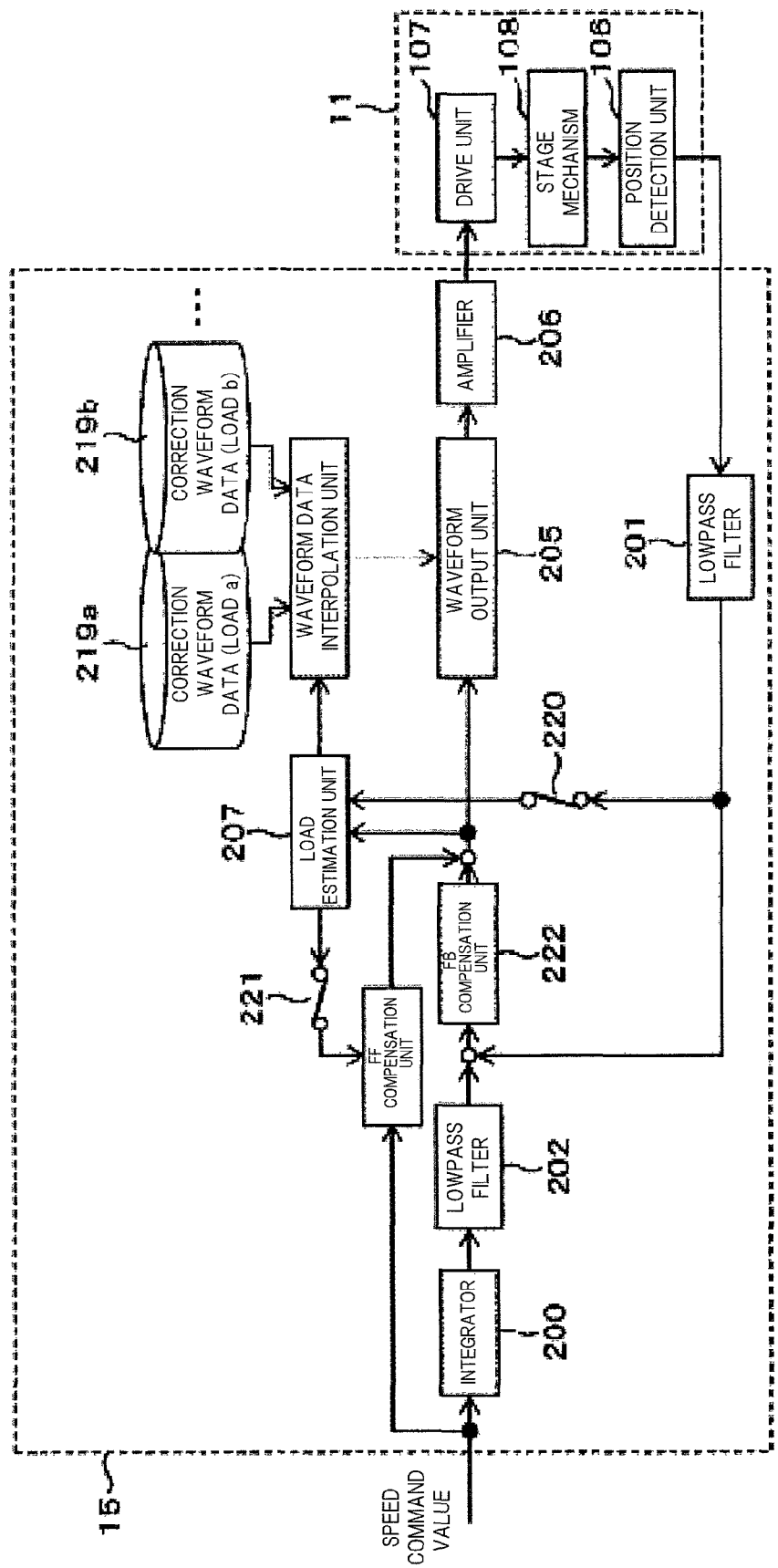
FIG. 15 is a configuration diagram of the stage apparatus illustrating a fifth embodiment of the present invention.

Another configuration of the present invention will be described in FIG. 15. Hereinafter, the parts that are the same as those of the first to fourth embodiments will be omitted in explanation. In this embodiment, a case in which the compensation unit 203 in the fourth embodiment with both of the switch 220 and the switch 221 ON has two degrees of free control will be described in detail. Compensation computation is performed by a feedback compensation unit 222 from a deviation between a signal having passed through a first low-pass filter 201 which removes a noise component from position information obtained from the position detection unit 106 and a signal having passed through an integrator 200 and a second low-pass filter 202, the signal from the speed command value to be inputted from the stage operation input unit 16. At this time, the second low-pass filter 202 has the same frequency characteristic as that of the first low-pass filter 201. This enables a phase difference between the signals obtained through two low-pass filters to be eliminated. Further, the speed command value is subjected to feedforward computation by a feedforward compensation unit 204, and the computation result and output of the feedforward compensation unit are added to be set as input into the waveform output unit 205. It is known that an actual speed of a piezo motor is slow when the load is large even if the same command value is provided, so that this is compensated by the feedforward compensation in a feedforward manner. At this time, the amount of feedforward compensation is changed by the load estimated by the load estimation unit 207.

In this way, it is possible to perform compensation at a higher degree of accuracy and obtain high speed stability.

Sixth Embodiment

Figure 16:
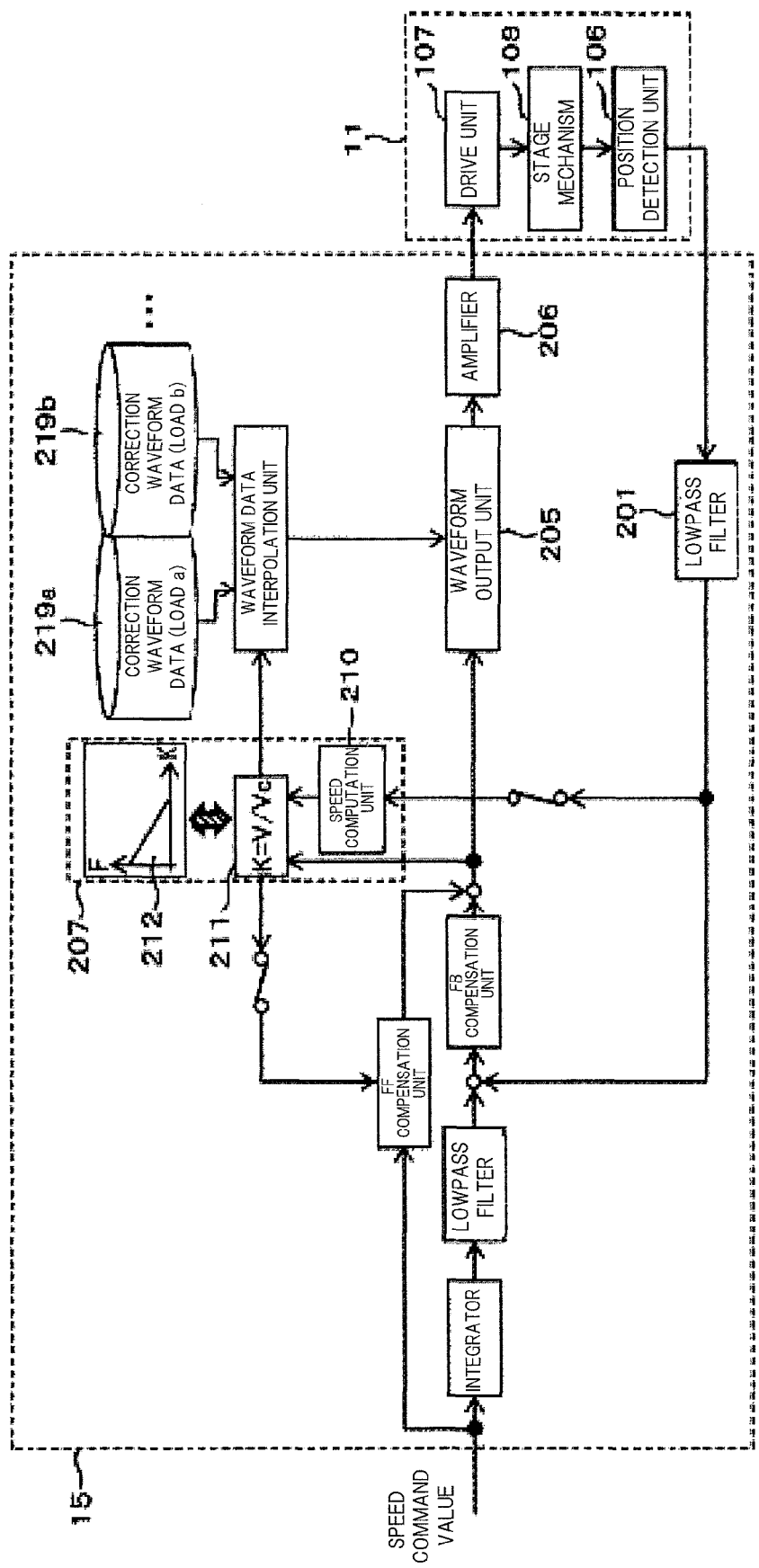
FIG. 16 is a configuration diagram of the stage apparatus illustrating a sixth embodiment of the present invention.

Another configuration of the present invention will be described in FIG. 16. Hereinafter, the parts that are the same as those of the first to fifth embodiments will be omitted in explanation. In this embodiment, the load estimation unit 207 will be described in more detail with reference to the configuration illustrated in FIG. 15.

The load estimation unit 207 includes a speed computation unit 210, a speed ratio computation unit 211, and a load characteristic table 212. The speed computation unit 210 computes a stage speed from output of the first low-pass filter 201, and, for example, can compute speed from a differential computation or an observer, etc. It is known that there is established a proportional relation between the stage speed v obtained from the speed computation unit 210 and a command value Vc for the waveform generation unit. When the proportional coefficient is set as K, it is known that the proportional coefficient K becomes smaller when the load F becomes larger, and a relation between the proportional coefficient K and the load F is determined depending on a motor to be used. Therefore, a relation between the proportional coefficient K and the load F is preliminarily stored for each motor, as a database (load characteristic table 212). Then, the speed ratio computation unit 211 computes the proportion K from the stage speed v obtained from the speed computation unit 210 and the command value Vc for the waveform generation unit, and estimates the load F by comparing the proportion K with database values. As a result, it is possible to perform the compensation at a higher degree of accuracy.

Seventh Embodiment

Another configuration of the present invention will be described in FIG. 17. Hereinafter, the parts that are the same as those of the first to sixth embodiments will be omitted in explanation. In this embodiment, a configuration when a position command value is provided from the stage operation input unit will be described.

Figure 17:
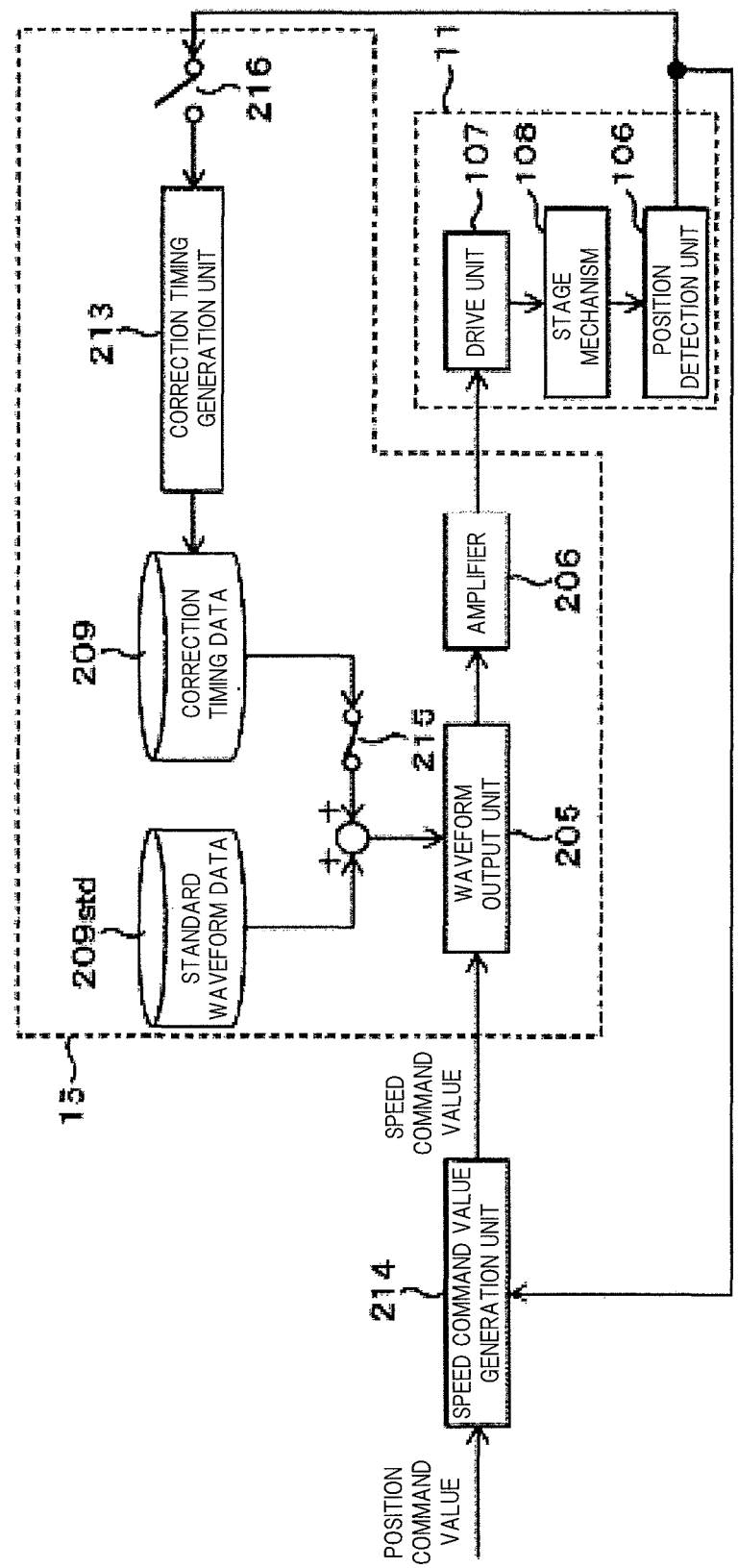
FIG. 17 is a configuration diagram of the stage apparatus illustrating a seventh embodiment of the present invention.
Figure 18:
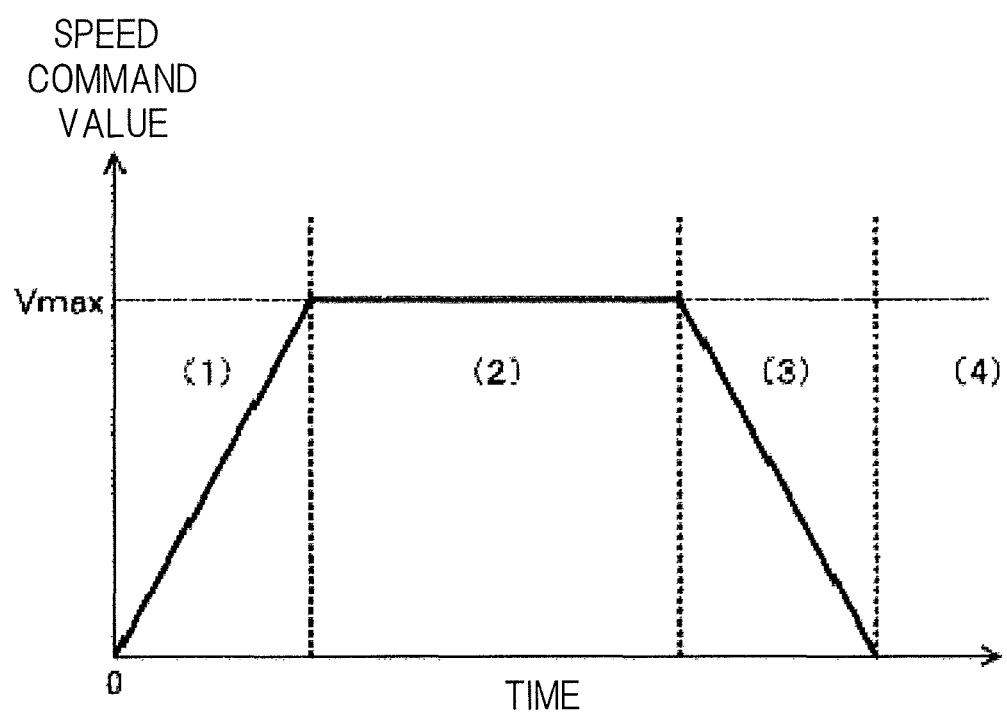
FIG. 18 is a diagram explaining an example of speed command values.

In FIG. 17, a speed command value generation unit 214 is added to the embodiments described above. When a position command value is inputted into the speed command value generation unit 214, for example, a speed pattern illustrated in FIG. 18 is generated and outputted from the speed command value generation unit 214. The speed pattern includes the following four phases.
(1) The speed command value increases at an acceleration set in advance.
(2) The speed command value is maintained after the speed command value reaches a set speed Vmax.
(3) The command speed decreases at a deceleration set in advance after the current position reaches a deceleration start position.
(4) Movement at very low speed and positioning at a target position are performed after the current position reaches near the position command value.

This is an example of the speed command value generation, and it is possible as long as a speed pattern in which a speed changes smoothly is generated. This is not intended to limit the present invention.

In this way, it is possible to reduce the speed fluctuation and obtain high speed stability, even if a position command value is provided.

In the embodiments described above, an example of the walking-type piezo motor is described, but the present invention can be applied to other than the walking-type piezo motor, as long as an actuator has a cyclic speed fluctuation.

Further, the present invention is not limited to the above-described embodiments and various modification examples are contained. For example, the above-described embodiments have been described in detail for easy understanding of the present invention and are not necessarily limited to provision of all the structure described. Moreover, part of the structure of an embodiment may be replaced by the structure of another embodiment and further the structure of an embodiment may be added to the structure of another embodiment. Further, part of the structure of the embodiments may be subjected to addition, deletion and replacement of other structure.

Further, some or all of the configurations, functions, processing units, processing means, etc. described above may be achieved by hardware such as designing with an integrated circuit. Further, the configurations, functions, etc. described above may be achieved by software while a processor interprets and executes programs achieving the functions. Information of programs, tables, files, etc. for achieving the functions can be stored in a memory or a recording device such as a hard disk or an SSD (Solid State Drive), or on a recording medium such as an IC card, an SD card, or a DVD.

In addition, control lines and information lines that are believed to be necessary in the explanation are illustrated, and all control lines and information lines in a product are not necessarily illustrated. In fact, almost the all configurations are mutually connected.

DESCRIPTION OF REFERENCES

1: SEM
2: lens barrel
3: sample chamber
4: electron gun
5: primary electron beam
6: convergence lens
7: objective lens
8: scanning polarizer
9: secondary particle
10: secondary particle detector
11: stage
12: sample
13: electronic optical system control unit
14: display device
15: stage control unit
16: stage operation input unit
100: base
101: movable table
102: guide rail
103: shaft
104: motor
105: scale
106: position detection unit
107: drive unit
108: stage mechanism
200: integrator
201, 202: low-pass filter
203: compensation unit
204: feedforward compensation unit
205: waveform output unit
206: amplifier
207: load estimation unit
208: correction data interpolation unit
209: correction timing data
209std: standard waveform data
210: speed computation unit
211: speed ratio computation unit
212: load characteristic table
213: correction timing generation unit
214: speed command value generation unit
215, 216, 218, 220, 221: switch
217: correction waveform generation unit
219: correction waveform data
219a: correction waveform data in load a
219b: correction waveform data in load b
222: feedback compensation unit
300 to 303: piezo element

The invention claimed is:

1. A stage apparatus including a stage mechanism that moves a sample mounted on the stage mechanism, a drive unit that drives the stage mechanism, a stage operation input unit that inputs an operational command for the stage mechanism, and a stage control unit that controls the stage mechanism in accordance with an input from the stage operation input unit, the stage apparatus comprising:
   a waveform generation unit that generates a voltage signal to be outputted to the drive unit from a command value that is inputted by the stage operation input unit and drive waveform data that shows a command voltage value at each predetermined time;
   an amplification unit that amplifies the generated voltage signal to be outputted to the drive unit; and
   a storage unit that stores standard waveform data showing a command voltage value at each predetermined time, and correction data correcting the standard waveform data so as to move the drive unit at constant speed,
   wherein the correction data corrects a command voltage value of the standard waveform data or an output timing of a command voltage value such that a difference between a first time history response and a second time history response is reduced to zero, the first time history response for displacement or speed when the stage mechanism is driven with use of the standard waveform data and the second time history response for displacement or speed when a speed of the stage mechanism is constant, and
   the standard waveform data is corrected by the correction data to be set as the drive waveform data.

2. The stage apparatus according to claim 1,
   wherein an output timing of a voltage signal is changeable in the waveform generation unit, and
   the correction data is data that corrects an output timing of each command voltage value in the standard waveform data to a timing at which a same voltage value is outputted as the each command voltage value when a speed of the stage mechanism is constant.

3. The stage apparatus according to claim 1,
   wherein the correction data is a function of a voltage value at constant time interval or of a voltage value for normalized time, and the correction data is data that corrects each command voltage value in the standard waveform data to a command voltage value to be outputted at each time when a speed of the stage mechanism is constant.

4. The stage apparatus according to claim 1, further comprising:
   a position measurement unit that measures a position of the stage mechanism; and
   a compensation unit that computes a command value to be inputted into the waveform generation unit from position information obtained by the position measurement unit and a command value to be inputted by the stage operation input unit.

5. The stage apparatus according to claim 1, further comprising:
a load estimation unit that estimates load applied to the stage mechanism from a command value for the waveform generation unit and position information detected by the position detection unit, or from an inclination angle of the stage mechanism;
a storage unit that stores correction waveform data in at least two loading states; and
a waveform data interpolation unit that generates the drive waveform data from the correction waveform data in at least the two loading states and a load estimation value estimated by the load estimation unit.

6. The stage apparatus according to claim 5,
wherein the compensation unit includes: a first low-pass filter that processes position information detected by the position detection unit; an integrator that integrates a speed command value to be inputted from the stage operation input unit; a second low-pass filter that processes output of the integrator and has a same frequency characteristic as the first low-pass filter; a feedback compensation unit that performs feedback control computation from a deviation between output of the first low-pass filter and output of the second low-pass filter; a feedforward compensation unit that performs feedforward control computation from the speed command value; and an adder that sets an added value as a command value for the waveform generation unit, the added value of outputs of the feedback compensation unit and the feedforward compensation unit, and
a parameter of the feedforward compensation unit is determined according to a degree of load estimated by the load estimation unit.

7. The stage apparatus according to claim 6,
wherein the load estimation unit includes a speed computation unit that computes a speed of the stage mechanism from output of the first low-pass filter and a speed ratio computation unit that computes a ratio between output of the speed computation unit and a command value for the waveform generation unit, and compares a ratio computed in the speed ratio computation unit with preliminarily-prepared correlation data between the load and a ratio between a speed of the stage mechanism and a command value for the waveform generation unit, thereby estimating the load.

8. The stage apparatus according to claim 7,
wherein the feedforward compensation unit obtains a reciprocal of the ratio.

9. The stage apparatus according to claim 1,
wherein the drive unit is a walking-type piezo actuator.

10. A sample observation apparatus that detects light or a secondary particle obtained by emitting light or a charged particle beam on a sample and obtains an image of the sample, the sample observation apparatus comprising:
a light source that generates the light or the charged particle beam;
an optical system that emits the light or the charged particle beam on the sample;
a detector that detects light or a secondary particle obtained by emitting the light or the charged particle beam;
a stage mechanism that moves a sample mounted on the stage mechanism;
a drive unit that drives the stage mechanism;
a stage operation input unit that inputs an operational command for the stage mechanism; and
a stage control unit that controls the stage mechanism in accordance with an input from the stage operation input unit, wherein the stage control unit includes:
a waveform generation unit that generates a voltage signal to be outputted to the drive unit from a command value that is inputted by the stage operation input unit and drive waveform data that shows a command voltage value at each predetermined time;
an amplification unit that amplifies the generated voltage signal to be outputted to the drive unit; and
a storage unit that stores standard waveform data showing a command voltage value at each predetermined time, and correction data correcting the standard waveform data so as to move the drive unit at constant speed,
the correction data corrects a command voltage value of the standard waveform data or an output timing of a command voltage value such that a difference between a first time history response and a second time history response is reduced to zero, the first time history response for displacement or speed when the stage mechanism is driven with use of the standard waveform data and the second time history response for displacement or speed when a speed of the stage mechanism is constant, and
the standard waveform data is corrected by the correction data to be set as the drive waveform data.

11. The sample observation apparatus according to claim 10,
wherein an output timing of a voltage signal is changeable in the waveform generation unit, and
the correction data is data that corrects an output timing of each command voltage value in the standard waveform data to a timing at which a same voltage value is outputted as the each command voltage value when a speed of the stage mechanism is constant.

12. The sample observation apparatus according to claim 10,
wherein the correction data is a function of a voltage value at constant time interval or of a voltage value for normalized time, and the correction data is data that corrects each command voltage value in the standard waveform data to a command voltage value to be outputted at each time when a speed of the stage mechanism is constant.

13. The sample observation apparatus according to claim 10, further comprising:
a load estimation unit that estimates load applied to the stage mechanism from a command value for the waveform generation unit and position information detected by the position detection unit;
a storage unit that stores correction waveform data in at least two loading states; and
a waveform data interpolation unit that generates the drive waveform data from the correction waveform data in at least the two loading states and a load estimation value estimated by the load estimation unit.

* * * * *